United States Patent
Tudosa et al.

(10) Patent No.: US 8,633,720 B2
(45) Date of Patent: Jan. 21, 2014

(54) METHOD AND APPARATUS FOR MEASURING MAGNETIC PARAMETERS OF MAGNETIC THIN FILM STRUCTURES

(75) Inventors: Ioan Tudosa, Fremont, CA (US); Yuchen Zhou, San Jose, CA (US); Jing Zhang, Los Altos, CA (US); Rajiv Yadav Ranjan, San Jose, CA (US); Yiming Huai, Pleasanton, CA (US)

(73) Assignee: Avalanche Technology Inc., Fremont, CA (US)

( * ) Notice: Subject to any disclaimer, the term of this patent is extended or adjusted under 35 U.S.C. 154(b) by 391 days.

(21) Appl. No.: 13/134,925

(22) Filed: Jun. 21, 2011

(65) Prior Publication Data

US 2012/0326712 A1   Dec. 27, 2012

(51) Int. Cl.
   *G01R 27/08*   (2006.01)
(52) U.S. Cl.
   USPC . 324/715; 324/230; 324/754.03; 324/754.01; 324/754.17; 324/754.2; 324/754.29
(58) Field of Classification Search
   USPC ............... 324/754.01, 754.1, 754.17, 754.2, 324/754.29, 754.03, 230, 658–716, 722, 324/724, 750.3; 73/105
   See application file for complete search history.

(56) References Cited

U.S. PATENT DOCUMENTS

| | | | |
|---|---|---|---|
| 6,927,569 B2 | 8/2005 | Worledge et al. | |
| 7,323,890 B2 | 1/2008 | Petersen et al. | |
| 7,732,881 B2 | 6/2010 | Wang | |
| 7,863,911 B2 * | 1/2011 | Hong et al. | 324/715 |
| 2009/0256220 A1 | 10/2009 | Horng et al. | |
| 2009/0285017 A1 | 11/2009 | Yamane et al. | |
| 2010/0023287 A1 * | 1/2010 | Worledge et al. | 702/65 |
| 2010/0033881 A1 | 2/2010 | Carey et al. | |
| 2010/0096716 A1 | 4/2010 | Ranjan et al. | |

OTHER PUBLICATIONS

D. C. Worledge and P. L. Trouilloud, Magnetoresistance measurement of unpatterned magnetic tunnel junction wafers by current-in-plane tunneling, Applied Physics Letters, vol. 83, No. 1, Jul. 7, 2003, pp. 84-86.
G. D. Fuchs, et al.; Spin-Torque Ferromagnetic Resonance Measurements of Damping in Nanomagnets; Applied Physics Letters vol. 91, 062507 2007; published online Aug. 7, 2007.
Yoshishige Suzuki and Hitoshi Kubota; Spin-Torque Diode Effect and Its Application; Journal of the Physical Society of Japan vol. 77, No. 3, Mar. 2008, 031002.
J. M. Beaujour, et al.; Ferromagnetic resonance linewidth in uttrathin films with perpendicular magnetic anisotropy Physical Review B 80, 180415 (R) 2009.
Mikihiko Oogane, et al.; Magnetic Damping in Ferromagnetic Thin Films; Japanese Journal of Applied Physics; vol. 45, No. 5A, 2006, pp. 3889-3891.

* cited by examiner

*Primary Examiner* — Arleen M Vazquez
*Assistant Examiner* — Son Le
(74) *Attorney, Agent, or Firm* — G. Marlin Knight

(57) ABSTRACT

High-frequency resonance method is used to measure magnetic parameters of magnetic thin film stacks that show magnetoresistance including MTJs and giant magnetoresistance spin valves. The thin film sample can be unpatterned. Probe tips are electrically connected to the surface of the film (or alternatively one probe tip can be punched into the thin film stack) and voltage measurements are taken while injecting high frequency oscillating current between them to cause a change in electrical resistance when one of the layers in the magnetic film stack changes direction. A measured resonance curve can be determined from voltages at different current frequencies. The damping, related to the width of the resonance curve peak, is determined through curve fitting. In embodiments of the invention a variable magnetic field is also applied to vary the resonance frequency and extract the magnetic anisotropy and/or magnetic saturation of the magnetic layers.

30 Claims, 3 Drawing Sheets

METHOD AND APPARATUS FOR MEASURING MAGNETIC PARAMETERS OF MAGNETIC THIN FILM STRUCTURES

FIELD OF THE INVENTION

The present invention relates to the measurement of characteristic parameters (e.g. damping of magnetization precession, magnetic anisotropy and saturation magnetization) of magnetic thin films stacks that show magnetoresistance including magnetic tunnel junctions (MTJ) and giant magnetoresistance spin valves. More particularly, the invention relates to making such magnetic measurements on unpatterned (blanket) thin film layer stacks.

BACKGROUND OF THE INVENTION

Magnetization dynamics is a key aspect of how magnetic technology based devices function. How the magnetization precesses around the effective magnetic field and how this precession is damped influences how fast and how energetically efficient a magnetic memory bit is switched in magnetoresistive random access memory (MRAM). The important magnetic parameters that describe these processes are the damping coefficient, intrinsic magnetic anisotropy, saturation magnetization.

A lot of research goes into finding the magnetic materials with the right parameters, but measuring the parameters typically involves either patterning the film into a device with submicron size that can be electrically characterized at microwave frequencies or breaking a piece of the film and inserting it into a microwave waveguide to study the ferromagnetic resonance. Both of these methods are costly in time and resources. A method that is preferably nondestructive is desired for obtaining timely feedback in the material selection as part of the design process and for monitoring of fabrication process at full film wafer level.

Worledge, et al. have described a method for measuring magnetoresistance (MR) and resistance area product (RA) of unpatterned magnetic tunnel junction film stacks. The RA is measured by making a series of four-point probe resistance measurements on the surface of an unpatterned wafer at various probe tip spacings. The probe tips are spaced apart on the order of microns for typical applications. The MR is obtained by repeating the measurement while applying different magnetic fields. (Worledge, et al.; Magnetoresistance measurement of unpatterned magnetic tunnel junction wafers by current-in-plane tunneling, Applied Physics Letters, Vol. 83, No. 1, 7 Jul. 2003, pp. 84-86; and U.S. Pat. No. 6927569.)

Commercially available automated metrology tools (e.g. from CAPRES), which are designed for measuring selected magnetic parameters of unpatterned MTJ film stacks, use multi-point probes with probe tip spacings in the micron range. Four- and twelve-point probes are available for these automated metrology tools. As an example, a CAPRES twelve-point probe is used with a 12-by-4 multiplexor (MUX) to select a total of 495 different pin-configurations each with different probe spacings (pitch). This approach allows the selected tests to be performed with different probe spacings without having to have the tips be movable with respect to each other. Existing automated metrology tools also provide means for applying a selected magnetic field to the test sample.

Y. Suzuki, et al. have discussed a "spin-torque diode effect" in patterned magnetic tunnel junction cells. A spin-polarized radio frequency (RF) current injected into a magnetic cell through the top and bottom electrodes exerts a torque to the local spin momenta and may excite ferromagnetic resonance (FMR) modes in the magnetic cell. FMR mode excitation in a magnetic tunnel junction is accompanied by the oscillation of its resistance and results in a rectification effect. The "spin-torque diode effect" provides a quantitative measure of the spin-torque, and it can be used to extract magnetic parameters of the cell. (Yoshishige Suzuki and Hitoshi Kubota; Spin-Torque Diode Effect and Its Application; Journal of the Physical Society of Japan, Vol. 77, No. 3, March, 2008, 031002.)

In US patent application 20100033881 Carey, et al. describe a magnetic field sensing system (usable in a head in disk drive) that uses a "spin-torque diode effect" that has been identified in magnetic tunnel junctions (MTJ). The effect is said to generate a measurable direct-current (DC) voltage across a MTJ device when an RF alternating current (AC) is applied with a frequency that is approximately the FMR frequency of the free layer. The explanation states that when the free layer and reference (pinned) layer magnetizations are in the film plane and are oriented at an angle, the AC passing through the layers of the MTJ device exerts an alternating torque on the free layer magnetization, rotating it towards and then away from the pinned layer magnetization during the complete AC cycle. However, the resistance is higher for electron current flows in one direction than the other. The resistivity of the whole layer stack changes when the magnetization of the free layer changes direction relative to that of the pinned layer, exhibiting a low (high) resistance state when the magnetization orientation of the two ferromagnetic layers in substantially parallel (anti-parallel) direction. The change in resistance follows the AC signal frequency (with a phase lag) when the frequency is sufficiently close to the free layer resonance frequency. The result is a DC output voltage that is proportional to the AC current. An external magnetic field allows the frequency window around the free layer resonance frequency to be tuned. In the embodiment described by Carey, et al. the AC current is applied in a conventional manner through the top and bottom electrodes in a fully patterned (completed) MTJ in a read head.

SUMMARY OF THE INVENTION

Embodiments of the present invention include a measurement technique and corresponding measurement devices for extracting magnetic parameters of damping of magnetization precession, magnetic anisotropy and saturation magnetization of certain magnetoresistive thin films stacks, such as MTJs, that are unpatterned (blanket) with little or no processing. In one embodiment two probe tips are positioned on the outer surface of the unpatterned film stack. A sequence of oscillating currents with a plurality of selected frequencies is driven through the two probe tips into the bottom magnetic layer below the spacer layer to cause magnetization precession in one of the magnetic layers and corresponding changes in electrical resistance of the layer structure. Embodiments of the invention obtain magnetic parameters by using the resonance frequency and the shape of the resonance curve obtained by measuring a voltage generated by systematically exciting the relevant magnetic layers with a range of high frequency (oscillating) currents applied through probe tips placed in contact with the unpatterned films.

The frequency range of the test current sequences is preferably selected to include the resonance frequencies of magnetization precession in the free layer (which generates the highest voltage) and the pinned layer which allows the resonance curves to be determined from voltages that are generated at different frequencies. The measured signal from the pinned layer has a lower amplitude and a different frequency than that from the free layer. The damping, which is related to the width of the resonance curve, is determined through standard curve fitting. The free and pinned layers in the test sample can each be a composite multilayer structure. The spacer separating the two magnetic layers can be either insulating as in magnetic tunneling junction (MTJ), or conductive as in giant magnetoresistance spin valve.

A method according to an embodiment of the invention sends a selected range of oscillating (AC) currents in the RF range through the layer stack including the spacer layer to induce small oscillations of the magnetizations of the magnetic layers and corresponding electrical resistance oscillations from the layer stack. The resonance frequencies of magnetization precession in the magnetic films can be found by varying the frequency of the oscillating current while measuring the resulting voltage. The DC voltage generated is the target variable, but in practice a low frequency lock-in technique can be used to extract the DC voltage from an AC signal. Systematically varying the frequency of the AC current while measuring the resulting voltage will result in a resonance curve from which the damping parameter of the individual magnetic layers can be extracted. The frequency range included in the scan is selected to include the resonance frequency of magnetization precession of at least one and preferably all of the magnetic layers. The measurement process can be repeated for a plurality of spacings of the probe tips and sample points.

An apparatus according to an embodiment of the invention comprises a multi-point probe having two or more probe tips able to contact the surface of the thin film stack of the sample, and a programmable high-frequency signal generator module coupled to the multi-point probe to inject high frequency (RF) oscillating current between the probes. In embodiments a low frequency lock-in amplifier can be used to modulate the RF signal so that the DC signal is also modulated by a low frequency. A voltage measuring unit measures the DC voltage or low frequency voltage between the probes at the same time. In an alternative embodiment, one of the probe tips penetrates into the film stack to make contact with the bottom magnetic layers below the spacer layer, which can be the free or pinned layer.

In embodiments of the invention, a selected magnetic field of varying characteristics (strengths and directions) is also applied to the sample to vary the resonance frequency and obtain voltage data for varying oscillating current signals under various magnetic fields from which the magnetic anisotropy and saturation magnetization of the magnetic layers can be extracted.

DETAILED DESCRIPTION OF THE INVENTION

In the following description of the embodiments, reference is made to the accompanying drawings that form a part hereof, and in which is shown by way of illustration of the specific embodiments in which the invention may be practiced. It is to be understood that other embodiments may be utilized without departing from the scope of the present invention. It should be noted that the figures discussed herein are not drawn to scale and thicknesses of lines are not indicative of actual sizes.

Figure 1:
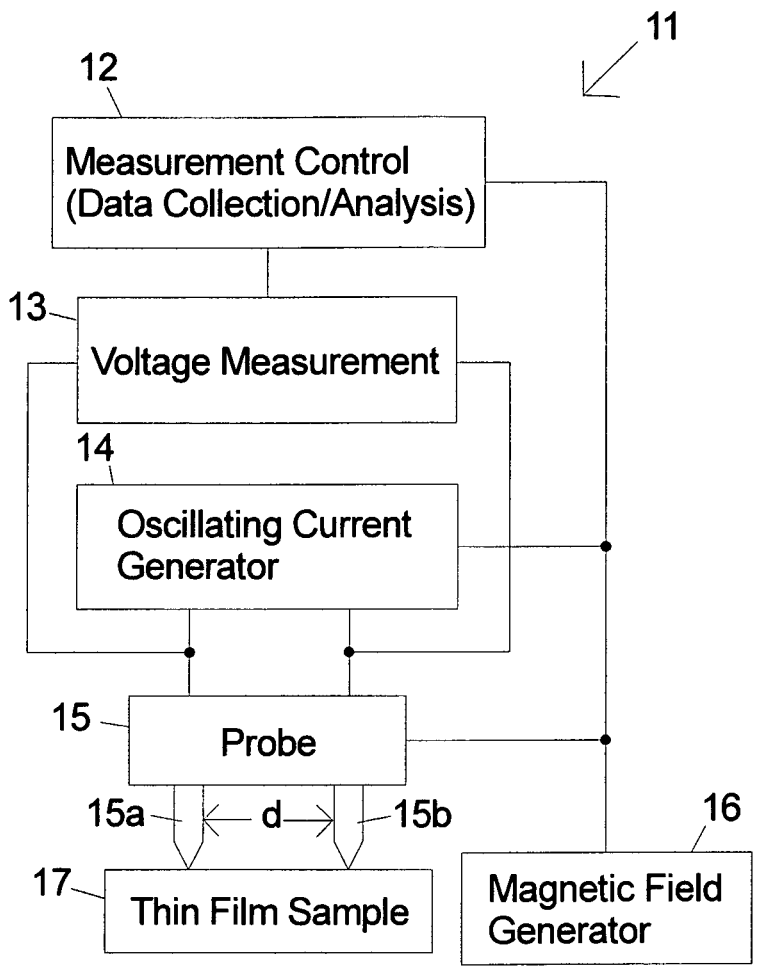
FIG. 1 is an illustration of selected components in an apparatus for measuring magnetic parameters of sample according to an embodiment of the invention.

FIG. 1 is an illustration of selected components in an apparatus 11 for measuring magnetic parameters of thin film sample 17 including damping of magnetization precession, magnetic anisotropy and saturation magnetization according to embodiments of the invention. It is an advantage of the invention that magnetic parameters can be obtained in the thin films on a substrate or wafer that is unpatterned (blanket) with little or no processing. An embodiment of the invention will be described that measures parameters of a magnetic tunnel junction (MTJ) stack structure that has a pinned layer and a free layer wherein the magnetic orientation of pinned layer is substantially harder to change in a magnetic field than that of free layer. While the free and pinned layers are perturbed locally from their equilibrium orientation by a RF frequency range current, the oscillations are probed by measuring or extracting the DC voltage generated. Alternative probing configurations are described in the figures below.

A test apparatus 11 for measuring magnetic parameters of film stacks that show magnetoresistance according to the invention comprises a multi-point probe 15 having two or more probe tips 15a, 15b able to contact the surface of the thin film structure 17. The multi-point probe 15 can include a multiplexor (not shown) for selecting from among a set of probe tips that are variously spaced apart according to the prior art. The programmable high-frequency oscillating current generator 14 is coupled to the multi-point probe 15 to inject high frequency oscillating current between the probe tips and into the test sample. In embodiments a low frequency lock-in amplifier can be included to modulate the RF signal so that the DC signal is also modulated by a low frequency. A voltage measurement module 13 is connected between the probe tips to measure DC or low frequency voltage between the same probe tips that are driven with the oscillating current signal. The apparatus includes a programmable magnetic field generator 16 which is disposed to apply a selected magnetic field to the sample as required. The strength and direction of the applied magnetic field is selectable under the control of the device. The test parameter sequences, data collection and data analysis are controlled by the measurement control unit 12 according to the prior art except as described herein. Data analysis can include, for example, automated curve fitting and peak finding using the sets of measurement data points, but the data can also be uploaded to a separate computer for analysis using standard signal analysis software and techniques.

Figure 2:
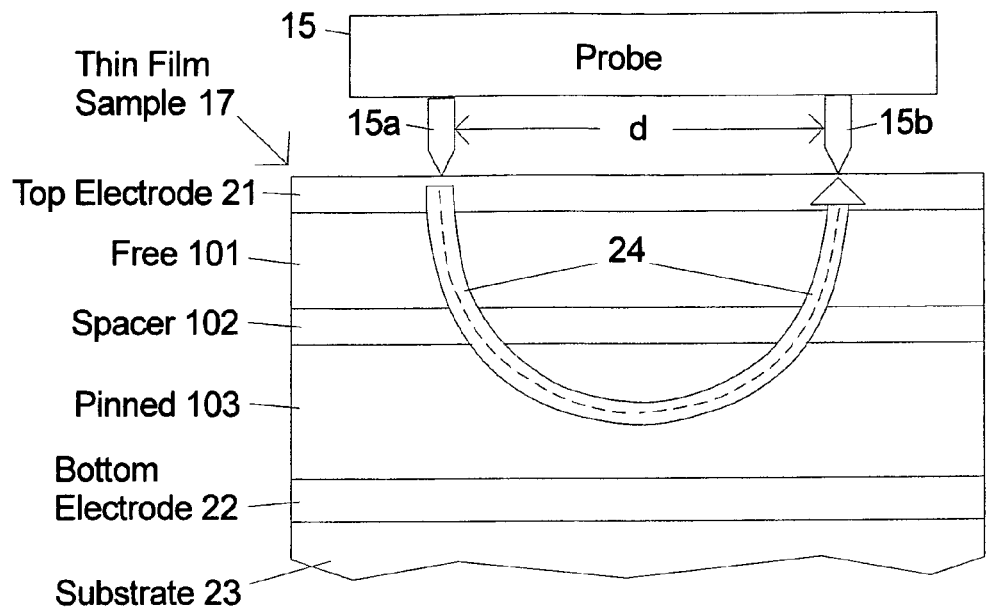
FIG. 2 illustrates a test configuration for performing measurements of an MTJ structure in accordance with an embodiment of the invention wherein the probe tips are positioned on the surface of the thin film sample.

FIG. 2 shows a thin film sample 17 which is a standard MTJ layer structure which is formed on substrate 23 and which consists of the following major units: a magnetic free layer 101, a nonmagnetic spacer layer 102, and a magnetic pinned layer 103. An MTJ structure typically includes a top electrode 21 and a bottom electrode 22. In this embodiment the two probe tips are both contacting the upper surface of the sample, which is the top electrode 21. The location of the layers 101 and 103 can be interchanged so that either of them can be on top without affecting the method of the invention. The probe tips deliver the high frequency current and also conduct the response of the magnetic layer stack as a DC voltage back to the voltage measurement module.

The MTJ pinned ferromagnetic layer has a fixed magnetization direction while the free layer has a magnetization direction that is switchable in two directions relative to that of the pinned layer. The method of the invention will also work with free and pinned layer structures that are composed of multiple layers. The resistivity of the whole MTJ layer stack changes when the magnetization of the free layer changes direction relative to that of the pinned layer, exhibiting a low(high) resistance state when the magnetization orientation of the two ferromagnetic layers in substantially parallel (antiparallel) direction. The spacer separating the two layers can be either insulating as in magnetic tunneling junction (MTJ), or conductive as in giant magnetoresistance spin valve.

A method according to the invention sends currents in the RF frequency range through the layer stack to induce small oscillations of the magnetization of the free layer and to a lesser extent of the pinned layer. The corresponding mixing of resistance oscillations and the AC current oscillations results in a small DC voltage being generated. Systematically varying (sweeping) the frequency of the AC current signal while measuring the resulting DC voltage will result in a composite resonance curve of the DC voltage from which the magnetic damping parameters of the free layer and the pinned layer can be extracted. The frequency range is selected to include the resonance frequency of magnetization precession in at least one and preferably all of the magnetic layers. The resonance curves and damping parameters for both free and pinned layers can be obtained from the voltage data, although in different frequency ranges. The highest voltage peak will be generated at the resonance frequency of the free layer, but the pinned layer resonance will generate a local peak in the voltage at a different frequency than the free layer. It is also possible using standard signal analysis techniques to distinguish separate resonance modes that correspond to separate magnetic layers that make up of a multi-layer structure.

Probe tips 15a, 15b are separated by a distance d and are positioned to land on the surface of the film without penetrating the thin film structure in this embodiment. This makes the process nondestructive. The anticipated range of probe tip spacing is approximately 1 micron to 500 microns. The measurement process can be repeated for a plurality of spacings of the probe tips and sample points. A 12-point probe with a selectable range of probe tip spacing according to the prior art can be used to obtain the measurements for a plurality of probe tip spacings and sample points without requiring movement of a probe tip.

The embodiment of the invention uses 2 probe tips in which the high frequency current driving signal is applied to the same 2 probe tips across which the resulting DC voltage is measured. A multiple-point probe with multiplexor selectable probe tips can be used to provide a selection of different tip spacings according to the prior art. It should be noted that prior art resistance measurements have to use 4 probe tips to remove the effect of lead and contact resistance from the measurements. In the prior art resistance measurements 2 probe tips are used to apply the driving current and 2 other probe tips are used to measure a voltage. In contrast, the method of the current invention is not measuring the resistance but is instead measuring the DC voltage generated across the spacer layer by the high frequency current signal. The 2-point probe is sufficient even in this case of low DC voltage. If the voltage is small, standard techniques, such as low frequency lock-in modulation and other signal amplification techniques, can be used to enhance the detection. Although ultimately it is DC voltage that is detected, in practice the signal to noise ratio (SNR) can be sufficiently low to require that the DC voltage be extracted from a low frequency AC signal. Therefore, an embodiment of the invention uses a lock-in amplifier that modulates the applied RF signal in the kHz range which results in the DC voltage also being modulated in kHz range (e.g. 0~1 MHz). This method enhances the SNR and allows the final DC voltage to be extracted from a low frequency AC voltage. Thus, embodiments of the method can obtain the final DC voltage by directly measuring the DC voltage or extract the DC voltage from a modulated signal.

To implement the full RF frequency range according to the invention the probe must be designed for proper impedance matching at the higher frequencies according to standard principles.

With a properly selected distance between the probe tips (neither too large nor too small), the resistivities of the individual magnetic layers 101 and 103 are such that most of the current passes through the bottom magnetic layer, which in this example is pinned layer 103 as illustrated in FIG. 2 by arrow 24. If the probe tips are too close together too much of the current will be shunted through the layers above the spacer layer. If the probe tips are too far apart the current will not flow through the spacer as desired. When the current flows through the spacer layer 102, it transfers spin angular momentum between layers 101 and 103. This transfer of angular momentum acts like a torque on the magnetization of both layers but it has a larger influence on the magnetic free layer 101. The magnetization of the free layer 101 will be perturbed and put into a precession motion around its equilibrium direction, and because the pinned layer 103 has a relatively fixed direction, the angle between the magnetization of these two layers will vary periodically. Because there is a magnetoresistance effect across the spacer layer 102, the resistance seen by the electric current will vary according to the magnetizations. When the frequencies of the current oscillations and the resistance oscillations match sufficiently there will be a resonance effect and a detectable DC voltage will be generated. When the frequency of the current and the frequency of the resistance oscillations do not match sufficiently there will not be a continuous DC voltage, only higher frequency alternating voltage. This is a typical resonance experiment where an external signal with a set frequency interacts with a system that has its own internal frequencies, in this case the precession of the magnetization and the resulting resistance oscillations. For practical MTJ film stacks the range of the driving signal is generally in the RF frequency range and more particularly is approximately 0.01-60 GHz. The resonance frequency of the MTJ film stack also depends on the effective magnetic field, but a rule of thumb is approximately 28 GHz/Tesla.

Figure 4:
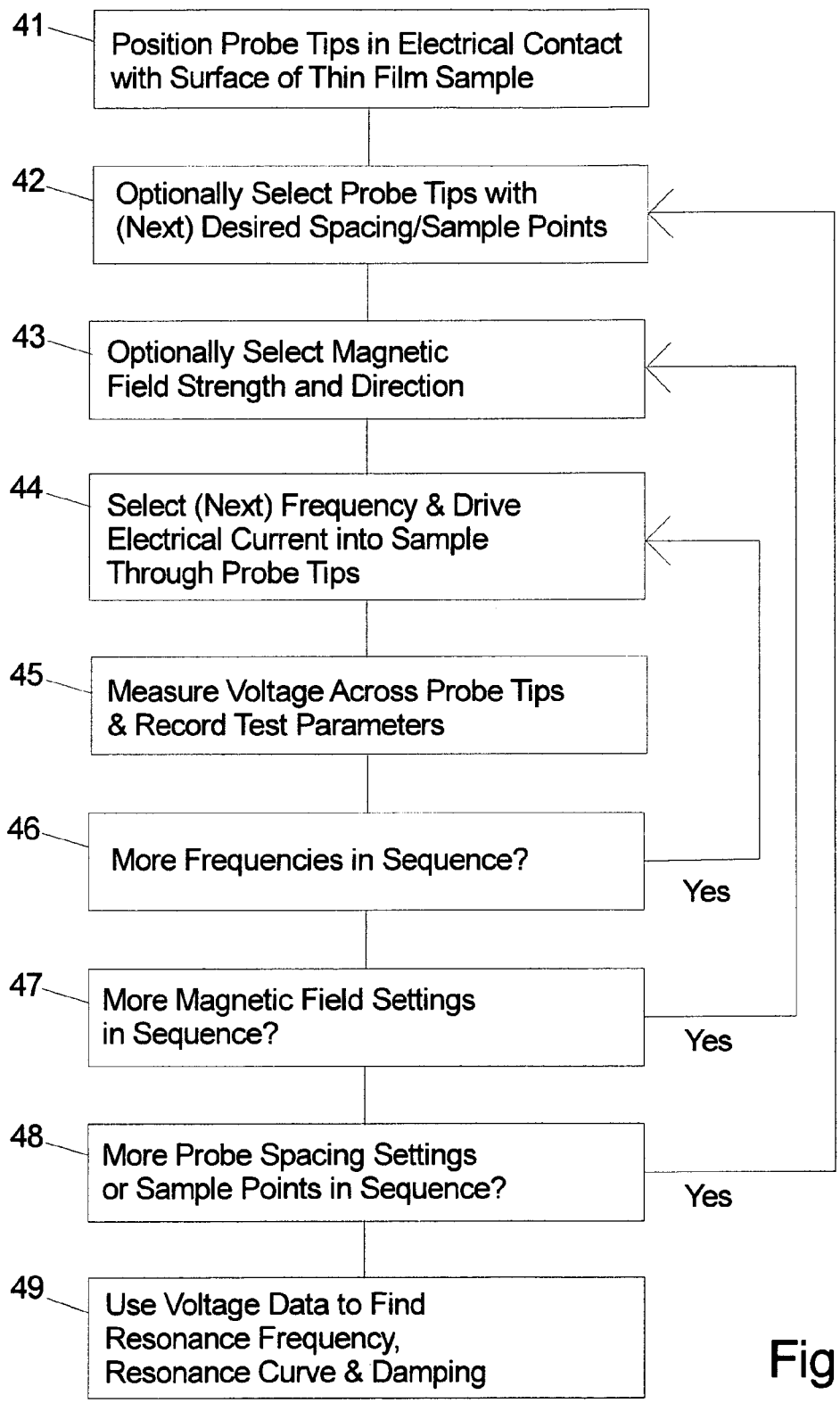
FIG. 4 illustrates a method for measuring magnetic parameters of sample according to an embodiment of the invention.

FIG. 4 illustrates a method for measuring magnetic parameters of a sample according to an embodiment of the invention. As shown the method includes 3 inner loops which are merely shown as an example of the many ways that test sequences using a variety of parameters can be ordered without deviating from the concepts of the invention. In this embodiment, 2 or more probe tips are positioned on the upper surface of the thin film sample as in step 41. The first loop selects the probe tip spacing (and sample points) as in step 42 for the two other loops. If a multipoint probe, such as a 12-point probe, with a multiplexor is used then the method selects the multiplexor configuration to select 2 of the probe tips having the desired spacing for the test loops. In alternative embodiments one of the probe tips can be moved in relation to the other to achieve changes in the spacing. For some tests an applied magnetic field of a given strength and direction will be selected as in step 43. If used the selected magnetic field parameter forms the second loop. Next the frequency for the oscillating current is chosen from the set of frequencies that will be used for the inner loop as in step 44. The resulting voltage across the probe tips is measured and recorded along the set of parameters that were in effect as in step 45. The inner loop checks on whether there are more frequencies in the test set to be applied as in step 46. The next loop exit test checks on whether there are more magnetic field parameters in the test set to be applied as in step 47. The outer loop checks on whether there are more probe tip spacings (and/or sample points) in the test set to be applied as in step 48. The method then uses the accumulated voltage data as a function of frequency to find the resonance frequency and the resonance curve from which the damping parameter is derived as in step 49. The analysis of the data can also take place during the looping process at any point when sufficient data has been accumulated. The analysis of the data will be discussed further below.

Figure 3:
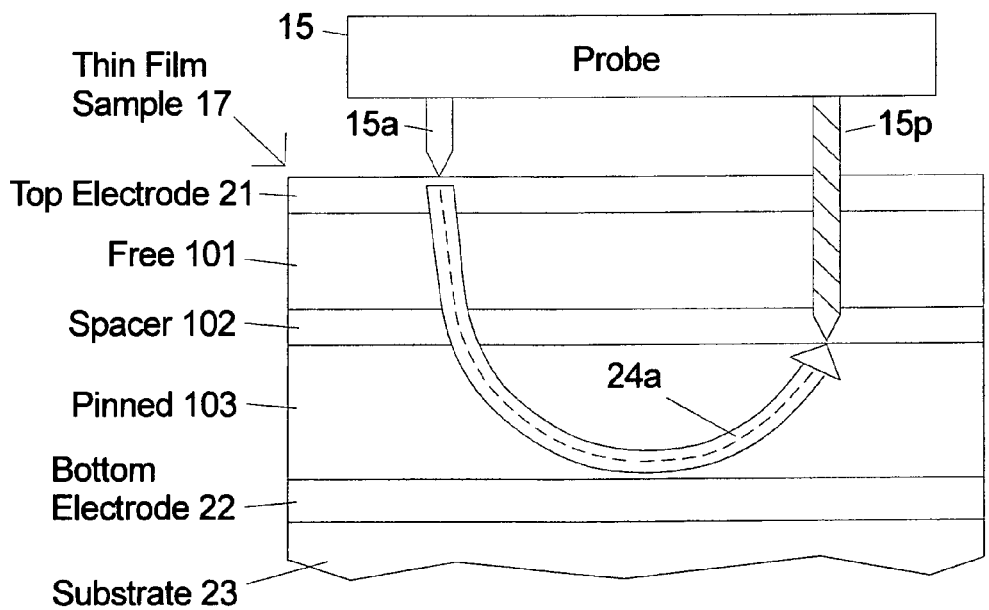
FIG. 3 illustrates a test configuration for performing measurements of an MTJ structure in accordance with an embodiment of the invention wherein one of the probing tips punctures some of the thin film layers.

Another embodiment of the invention is illustrated in FIG. 3 where one of the probing tips 15*p* breaks through the top electrode layer 21, the free layer 101 and the spacer layer 102 to reach and make contact with the bottom magnetic layer which in this embodiment is the pinned layer 103. The other probe tip 15*a* rests on the surface. In this embodiment the signal current traverses the spacer layer 102 in one direction only as illustrated by arrow 24*a* with potentially reduced response from the film stack, but the distance d between probing tips is less critical, because most of the response comes from a small local region under the probe tip that rests on the surface. In an alternative embodiment the probe tip 15*p* is positioned to penetrate at the outer edge of the sample and then the other tip or tips are moved to scan the surface of the sample, touching it nondestructively. In this embodiment the probe tip that penetrates into the layers remains in a fixed position while the other tip or tips are moved over the surface to sample different points on the film.

This embodiment can use the same measuring method as described above in FIG. 4. It requires that the probe tip be designed with the mechanical properties to allow it to break through the thin films in a controlled manner preferable without damage to the probe tip. The embodiment in which the other tip or tips are moved while the probe tip that penetrates the layers remains in a fixed position requires a mechanical design that allows sufficient controlled relative movement preferably without damaging the probing tips.

There a few measurement considerations that apply to each of the embodiments of the invention. The measuring probe tip has to have an area small enough to achieve sufficient impedance matching with the electronics for the high frequency current signal. A smaller probing area will make the measurement more localized, with less spatial averaging.

In the following discussion, the terms top and bottom layers will be used with respect to the spacer layer to discuss current flow. All layers above the spacer (e.g., free layer and top electrode) are included in the term "top layers" and all layers below the spacer (e.g., pinned layer and bottom electrode) are included in "bottom layers". The substrate is below the bottom layers. The relative resistivity of the top and bottom layers affects the path of the current flow. The top layers should have a relatively high resistivity to force the electric current to pass through the spacer layer into the bottom layers. Preferably the top layers are sufficiently thick and hard to withstand the mechanical forces of the probe tips contacting the surface. However, if the top layers are too thick or too conductive, then there is an adverse effect of excessive current shunting, where almost all the electric current flows through the top layers only and does not flow through the spacer layer. Resistance to oxidation is also desirable to preserve the electrical properties of the upper film surface. On the other hand, increased resistance, e.g. from oxidation, is not a major problem, because the current will still pass through the spacer as this is a path of lower resistance. However, there is also a concern that impedance matching between the probe tips and the film surface be sufficient for adequate current transfer from the tips to the film surface.

The bottom layers should have relatively low resistivity to allow most of the current from the probing tips to flow through the bottom magnetic layer. The bottom layers can be as thin or thick as required by the specific application. Additional layers can be incorporated in the structure of the free or pinned layers to adjust their resistivity to the needed values so that measurements according to the invention can be performed.

In the prior art typically the damping parameter of the magnetization dynamics is measured in ferromagnetic measurements with waveguides sending microwaves on the film and measuring the width of the absorption resonance. This width is directly proportional with the damping parameter. This technique requires that a small piece (e.g. ~1 cm$^2$) of the film be placed in a microwave waveguide or cavity. Another technique involves micro-patterning the film in submicron size devices and sending high frequency current from top to bottom through the magnetic layers. The target signal is a small rectified DC voltage. A fitting for the resonance curve of this voltage vs. input frequency will then produce an effective damping parameter. The main drawback of this method is the cost, both in time and resources, with possible complications from having to take into account the effect of the device shape on the curve fitting.

A faster, nondestructive, electrical method is desirable for quicker feedback and turnaround time. In embodiments of the test method according to the invention the response of the film stack is a DC voltage and yields a resonance curve when plotted versus the signal frequency. In an ideal curve the damping parameter is equal to $f_0/2\Delta f$, with $f_0$ being the resonance frequency measured at the apex point of the resonance peak in the resonance curve and $\Delta f$ being the full width at half maximum of the resonance peak. The resonant frequency $f_0$ depends on the external applied magnetic field H, internal magnetic anisotropy fields and saturation magnetization among other parameters.

Therefore, in an embodiment of invention the saturation magnetization M and magnetic anisotropy K can be measured by applying a variable external magnetic field to the thin film structure as part of the test sequences. The direction of the applied magnetic field is important for the measurement method. The magnetic field is preferably applied either in the plane of the magnetic films or perpendicular to it. When the external magnetic field is varied along different directions, either in the plane of the film stack or perpendicular to it, the magnetic anisotropy can be extracted by fitting the curve $f_0(H)$. This is usually done quite reliably in the classical ferromagnetic resonance experiments with microwave waveguides. For example, the formula used for the resonance frequency versus external magnetic field applied perpendicularly to film plane is:

$$f = \frac{\gamma}{2\pi}\left(\mu H - \mu M + \frac{2K}{M}\right),$$

where f is the resonance frequency, γ is the gyromagnetic ratio for the magnetic material studied, μ is vacuum magnetic permeability, H is the external applied field, M is saturation magnetization of the magnetic material and K is its perpendicular anisotropy. From this kind of curves saturation magnetization M and magnetic anisotropy K can be extracted according to the invention for a specific thin film structure.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

The invention claimed is:

1. A method for measuring magnetic parameters of a thin film sample having a layer structure including a top magnetic layer and a bottom magnetic layer separated by a spacer layer, the method comprising:
   positioning at least two probe tips in electrical contact with a surface of the thin film sample, the two probe tips being separated by a selected distance;
   driving a sequence of oscillating currents with a plurality of selected RF frequencies through the two probe tips through the spacer layer into the bottom magnetic layer to cause magnetization precession in one of the magnetic layers and corresponding changes in electrical resistance of the layer structure;
   measuring a sequence of voltages between the two probe tips corresponding to the selected frequencies in the sequence of oscillating currents; and
   deriving a magnetic parameter from the sequence of voltages and the corresponding selected frequencies.

2. The method of claim 1 wherein the plurality of selected frequencies have a range of frequencies that includes a resonance frequency of magnetization precession in one of the magnetic layers and deriving a magnetic parameter further comprises determining a resonance frequency as the selected frequency of oscillating current that generates a DC voltage peak.

3. The method of claim 2 further comprising determining a resonance curve from the sequence of voltages compared to the corresponding selected frequencies.

4. The method of claim 3 wherein deriving a magnetic parameter further comprises determining a damping parameter using the resonance frequency and a selected width of the resonance curve.

5. The method of claim 1 further comprising repeating the steps of driving a sequence of oscillating currents and measuring a sequence of voltages for a plurality of selected distances separating the two probe tips.

6. The method of claim 1 further comprising selectively applying a magnetic field to the thin film sample.

7. The method of claim 6 further comprising systematically changing a characteristic of the magnetic field between selected voltage measurements.

8. The method of claim 7 wherein deriving a magnetic parameter further comprises deriving the saturation magnetization using the sequence of voltages for the corresponding selected frequencies for a plurality of magnetic field characteristics.

9. The method of claim 7 wherein deriving a magnetic parameter further comprises deriving the magnetic anisotropy using the sequence of voltages for the corresponding selected frequencies for a plurality of magnetic field characteristics.

10. The method of claim 1 wherein the selected frequencies are in an approximate range of 0.01 to 60 GHz and the selected distance separating the two probe tips is in an approximate range from 1 micron to 500 microns.

11. A method for measuring magnetic parameters of a thin film sample having a layer structure including a top magnetic layer and a bottom magnetic layer separated by a spacer layer, the method comprising:
    positioning a first probe tip in electrical contact with a surface of the thin film sample and positioning a second probe tip in electrical contact with the bottom magnetic layer by penetrating the second probe tip through the top magnetic layer and the spacer layer, the first and second probe tips being separated by a selected distance;
    driving a sequence of oscillating currents with a plurality of selected RF frequencies through the first and second probe tips into the bottom magnetic layer below the spacer layer to cause magnetization precession in one of the magnetic layers and corresponding changes in electrical resistance of the layer structure;
    measuring a sequence of voltages between the two probe tips corresponding to the selected frequencies in the sequence of oscillating currents; and
    deriving a magnetic parameter from the sequence of voltages and the corresponding selected frequencies.

12. The method of claim 11 wherein the plurality of selected frequencies have a range of frequencies that includes a resonance frequency of magnetization precession in one of the magnetic layers and deriving a magnetic parameter further comprises determining a resonance frequency as the selected frequency of oscillating current that generates a DC voltage peak.

13. The method of claim 12 wherein deriving a magnetic parameter further comprises determining a resonance curve from the sequence of voltages compared to the corresponding selected frequencies and determining a damping parameter using the resonance frequency and a selected width of the resonance curve.

14. The method of claim 11 further comprising repeating the steps of driving a sequence of oscillating currents and measuring a sequence of voltages for each of a plurality of selected distances separating the first and second probe tips.

15. The method of claim 14, wherein the second probe tip in electrical contact with the bottom magnetic layer is located at an outer edge of the sample and the method further comprises moving the first probe tip across the surface of the thin film sample between voltage measurements to provide the plurality of selected sample points for the first probe tip.

16. The method of claim 11 further comprising selectively applying a magnetic field to the thin film sample and systematically changing a characteristic of the magnetic field between selected voltage measurements.

17. The method of claim 16 wherein deriving a magnetic parameter further comprises deriving the saturation magnetization using the sequence of voltages for the corresponding selected frequencies for a plurality of magnetic field characteristics.

18. The method of claim 16 wherein deriving a magnetic parameter further comprises deriving the magnetic anisotropy using the sequence of voltages for the corresponding selected frequencies for a plurality of magnetic field characteristics.

19. An apparatus for measuring magnetic parameters of a thin film sample having a layer structure including a top magnetic layer and a bottom magnetic layer separated by a spacer layer, comprising:
    a probe having two or more probe tips able to contact a surface of the thin film sample;
    an oscillating current generator, with selectable frequencies, coupled to the probe, that drives an oscillating current of a selected frequency between two probe tips into the bottom magnetic layer through the spacer layer to cause magnetization precession in one of the magnetic layers and corresponding changes in electrical resistance of the layer structure;

a voltage measurement unit coupled to the probe that measures voltage between the two probe tips; and a measurement control unit that controls the oscillating current generator and receives voltage data from the voltage measurement unit and executes test sequences which include driving a selected sequence of oscillating currents, including a plurality of frequencies of oscillating currents, into the bottom magnetic layer and recording the voltage data for each frequency of oscillating current.

20. The apparatus of claim 19, further comprising a magnetic field generator, coupled to the measurement control unit, that generates a selectable magnetic field at thin film sample and wherein test sequences executed by the measurement control unit include applying a selected magnetic field to the thin film sample.

21. The apparatus of claim 19, wherein one of the probe tips is adapted to punch into the layer structure through the top magnetic layer and the spacer layer to make electrical contact with the bottom magnetic layer.

22. The apparatus of claim 19, wherein the probe includes a first probe tip adapted to punch into the layer structure during a test sequence to make electrical contact with the bottom magnetic layer at the edge of the thin film sample and a second probe tip that is movable in relation to the first probe tip and wherein test sequences executed by the measurement control unit include moving a second probe tip across the surface of the thin film sample to obtain measurements at a plurality of points on the surface of the thin film sample.

23. The apparatus of claim 19 wherein the plurality of frequencies of oscillating currents are in an approximate range of 0.01 to 60 GHz and a distance separating the two probe tips is in an approximate range from 1 micron to 500 microns.

24. The apparatus of claim 19 wherein the plurality of frequencies includes a resonance frequency of magnetization precession of at least one of the magnetic layers and the measurement control unit determines a resonance frequency as the frequency of oscillating current that generated a DC voltage peak.

25. The apparatus of claim 24 wherein the measurement control unit determines a resonance curve from the voltage data for the plurality of frequencies of oscillating currents.

26. The apparatus of claim 25 wherein the measurement control unit determines a damping parameter using the resonance frequency and a selected width of the resonance curve.

27. The apparatus of claim 19 further comprising a programmable magnetic field generator coupled to the measurement control unit and wherein the measurement control unit selectively applies a magnetic field to the thin film sample during test sequences and systematically changes the magnetic field during the test sequences to obtain the voltage data for selected frequencies of oscillating current under different magnetic fields.

28. The apparatus of claim 27 wherein the measurement control unit derives a saturation magnetization using the voltage data for selected frequencies of oscillating current under different magnetic fields.

29. The apparatus of claim 27 wherein the measurement control unit derives a magnetic anisotropy magnetization using the voltage data for selected frequencies of oscillating current under different magnetic fields.

30. The apparatus of claim 19 wherein the oscillating current generator further comprises a low frequency lock-in amplifier that modulates the RF signal with a low frequency.

* * * * *